(12) United States Patent  
Eyre et al.

(10) Patent No.: US 6,514,661 B1  
(45) Date of Patent: Feb. 4, 2003

(54) PROCESS FOR FORMING A COLORED IMAGE HAVING A DOMINANT ATTRIBUTE

(75) Inventors: Brian S. Eyre, Landenberg, PA (US); Michael M. Merabi, Havertown, PA (US)

(73) Assignee: E. I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/687,596

(22) Filed: Oct. 13, 2000

Related U.S. Application Data

(60) Provisional application No. 60/159,897, filed on Oct. 15, 1999.

(51) Int. Cl.[7] .............................. G03C 5/58; G03C 8/50
(52) U.S. Cl. ...................... 430/259; 430/256; 430/293; 430/325; 430/358; 430/322; 430/9
(58) Field of Search ................................. 430/325, 293, 430/257, 358, 394, 256

(56) References Cited

U.S. PATENT DOCUMENTS

| | | | |
|---|---|---|---|
| 4,260,673 A | * 4/1981 | Krech | ......................... 430/143 |
| 4,272,620 A | 6/1981 | Ichimura | |
| 4,287,335 A | 9/1981 | Ichimura | |
| 4,339,524 A | 7/1982 | Ichimura et al. | |
| 4,564,580 A | 1/1986 | Ichimura et al. | |
| 4,777,114 A | 10/1988 | Ichimura et al. | |
| 5,085,698 A | 2/1992 | Ma et al. | |
| 5,532,115 A | 7/1996 | Bodager et al. | |
| 5,616,439 A | 4/1997 | Bodager et al. | |
| 5,637,438 A | * 6/1997 | Maerz et al. | ................. 430/162 |
| 6,244,701 B1 | * 6/2001 | Moriya et al. | ............... 347/105 |

FOREIGN PATENT DOCUMENTS

| | | | | |
|---|---|---|---|---|
| EP | 550338 A1 | * 7/1993 | ............. | G03F/3/10 |
| EP | 704761 A1 | * 9/1995 | ............. | G03F/3/10 |
| EP | 740209 A2 | * 4/1996 | ............. | G03F/3/10 |

OTHER PUBLICATIONS

K. Ichimura and S. Wantanabe, J. Polym. Sci., Polym. Lett. Ed., 18, 613 (1980).

K. Ichimura and S. Wantanabe, J. Polym. Sci., Polym. Lett. Ed., 20, 1411, 1419 (1982).

* cited by examiner

*Primary Examiner*—Janet Baxter
*Assistant Examiner*—Yvette M. Clarke

(57) ABSTRACT

A process for making an element for forming a final image with an overall attribute by exposure to actinic radiation, the process comprising:

providing a support element having a surface;

applying a first layer having a first surface and a second surface to the surface of the support element, the first surface of the first layer being adjacent to the surface of the support element and the second surface of the first layer being opposite the first surface;

applying, prior to image-wise exposure to actinic radiation, a second layer adjacent to the second surface of the first layer, the second layer having an inner surface and an outer surface, the first layer comprising a photosensitive composition and a feature which imparts a dominant attribute to the first layer, the feature being selected from the group consisting of a fluorescent feature, a metallic feature, an opacity enriching feature or a combination of at least two of the foregoing features, the second layer comprising a first colorant; wherein the overall attribute of the final image is defined by the dominant attribute of the first layer. The invention also relates to an element for forming a final image having a dominant attribute.

15 Claims, 1 Drawing Sheet

PROCESS FOR FORMING A COLORED IMAGE HAVING A DOMINANT ATTRIBUTE

This application claims benefit of Ser. No. 60/159,897 Oct. 15, 1999.

FIELD OF THE INVENTION

This invention relates to the formation of images. In particular, this invention relates to the formation of an image using a photosensitive element comprising a layer having a dominant attribute and a layer comprising a colorant applied thereon, and subsequent transfer of the image to any desired support.

BACKGROUND OF THE INVENTION

Photosensitive elements used in image-reproduction processes are known in the graphics arts industry. Such elements are usually exposed to actinic radiation through an image-bearing transparency, such as a color separation transparency, to produce an image which is either a positive or negative with respect to the transparency used.

Such photosensitive elements are widely used in off-press color proofing to simulate the images produced by printing. In a surprint proof, all of the colored images are superimposed, by, for example, multiple exposure, lamination, or transfer, onto a single support. Unlike an overlay proof, the colored images cannot be separated and viewed individually.

Various processes for producing copies of images involving photopolymerization and thermal transfer techniques are known as disclosed in U.S. Pat. Nos. 5,616,439 and 5,532,115. In these processes, a photopolymerizable layer coated on a suitable support is imagewise exposed to a photographic transparency. The surface of the exposed layer is then pressed into contact with the image receptive surface of a separate element, and at least one of the elements is heated to a temperature above the transfer temperature of the unexposed portions of the layer. The two elements are then separated whereby the thermally transferable unexposed image areas of the composite transfer to the image receptive element. If the element is not precolored, the tacky, unexposed image may now be selectively colored with a desired toner, the application of which could be in film or powder form.

There is a need in the industry to form images having an overall attribute, such as a metallic luster or a fluorescent hue or color saturation. One approach for a metallic or fluorescent appearance is to incorporate into the colored composition a metallic ink or fluorescent ink to achieve an additive effect. However, one problem associated with this is keeping the material having the dominant attribute (fluorescence or metallic) in suspension. In addition, such incorporation may adversely affect the coating quality by decreasing the uniformity and varying the density of the colored composition. Furthermore, the metallic or fluorescent ink may possess certain opacity that adversely affects the desired additive effect of the incorporated colored composition. Color saturation might be accomplished by applying successive ink layers or adjusting colorant proportion. Moreover, any of these known methods for achieving the attributes of color saturation, fluorescence or metallic may adversely affect the color predictability of the incorporated colored composition.

Therefore, it is desirable to develop a process that forms images having an overall attribute but that does not possess the described disadvantages.

SUMMARY OF THE INVENTION

This invention provides a process for providing an overall attribute to a photosensitive element.

In one aspect the invention is directed to a process for making an element for forming a final image with an overall attribute by exposure to actinic radiation, the process comprising:

providing a support element having a surface;

applying a first layer having a first surface and a second surface to the surface of the support element, the first surface of the first layer being adjacent to the surface of the support element and the second surface of the first layer being opposite the first surface;

applying, prior to image-wise exposure to actinic radiation, a second layer adjacent to the second surface of the first layer, the second layer having an inner surface and an outer surface, the first layer comprising a photosensitive composition and a feature which imparts a dominant attribute to the first layer, the feature being selected from the group consisting of a fluorescent feature, a metallic feature, an opacity enriching feature or combination of at least two of the foregoing features, the second layer comprising a first colorant;

wherein the overall attribute of the final image is defined by the dominant attribute of the first layer.

The first layer may include a first photosensitive composition, with the second layer including a second photosensitive composition.

The feature which imparts a dominant attribute to the first layer may be selected from the group consisting of a metallic material, a fluorescent material, an opacity enriching material and combinations of at least two of these features.

The first colorant may be selected from the group consisting of a dye or pigment.

The first layer may comprise a second colorant, which may be a dye or pigment which may be different from the color of the second colorant.

The process may further comprise the step of exposing the element with actinic radiation through a separation transparency having a pattern, the separation transparency applied to the outer surface of the second layer, for a period of time sufficient to form image-wise exposed regions on the first layer; removing the separation transparency and developing the element to produce a pattern which is substantially the same as the pattern of the separation transparency.

The first layer may be adhered to the support element with an adhesive and a release layer may be located between the adhesive and the surface of the support element, the process further comprising the step of, applying a transfer element to the produced pattern; separating the support element from the first layer to reveal the adhesive and adhering the revealed adhesive to a permanent support.

The invention is also directed to a photosensitive element made by the process of this invention.

The invention is further directed to an element for forming a final image having an overall attribute by exposure to actinic radiation, comprising:

a support element having a surface;

a first layer having a first surface and a second surface, the first surface of the first layer being adjacent to the surface of the support element and the second surface of the first layer being opposite the first surface;

a second layer adjacent to the second surface of the first layer and applied prior to image-wise exposure to actinic radiation, the second layer having an inner surface and an outer surface, the first layer comprising a photosensitive composition and a feature which imparts a dominant attribute to the first layer, the feature being selected from the group consisting of a fluorescent feature, a metallic feature, an opacity enriching feature or a combination of at least two of the foregoing features, the second layer comprising a first colorant; wherein the overall attribute of the final image is defined by the dominant attribute of the first layer.

The element may further comprise a separation transparency having a pattern, the separation transparency applied to the outer surface of the second layer wherein exposure of the element to actinic radiation through the separation transparency for a sufficient period of time forms image-wise exposed regions on the first layer resulting in a pattern formed on the element which is substantially the same as the pattern of the separation transparency.

This invention provides for high resolution, high quality, full color surprint proofs having a dominant attribute on virtually any proofing paper stock or other permanent support. It also provides for development during imaging with tap water as the liquid developer to minimize or eliminate concerns regarding toxicity, waste treatment, and corrosion. It also provides for color flexibility and the capability for addition of the colorant-containing composition only to the approximate areas where an image is desired. It also provides for the addition of more than one color to a single layer.

DETAILED DESCRIPTION OF THE INVENTION

Photosensitive Element

Figure 1:
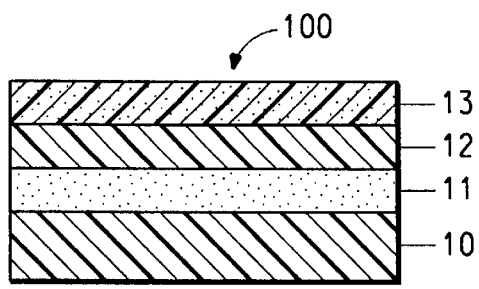
FIG. 1 is a cross-section of a photosensitive element useful in the process of the invention with a support element.

One aspect of the invention is a process for providing an overall attribute to a photosensitive element 100. As shown in FIG. 1, a photosensitive element made by the present invention includes a support element 10, optionally an adhesive layer 11, a first layer 12 adjacent to the support element, and a second layer 13 adjacent to the first layer 12.

As used herein, the term "adjacent" is meant to refer to the position of a first component layer relative to the reference component, such that when the first component layer is adjacent to the reference component, it does not necessarily mean that the first component layer is next to the reference component, but merely that the first component layer is close to the reference component. In other words, the term "adjacent" does not exclude the possibility that there is an intervening element between the first component layer and the reference component. For example a first or second layer adjacent to a surface of a support element means that there may be one of more layers located between the first or second layer and the support element.

The term "overall attribute" includes a physical and/or visual appearance of the photosensitive element that is imparted to the final image. The overall attribute may be fluorescent, metallic, color saturated, opaque, textured, or a combination of at least two of these features. The overall attribute is dictated or defined by the dominant attribute. By "defined" or "dictated" it is meant that the dominant attribute provides the primary or preeminent, although not sole, feature that is exhibited as an overall attribute. The feature which imparts a dominant attribute may be, for example, fluorescent, metallic, or a combinations of these features. The dominant attribute may be colored, and can be a color that is different from the final color of the overall attribute. Where there is a layer containing a colorant that excludes the dominant attribute, the dominant attribute can be a color that differs from the colorant of that layer. The dominant attribute can be provided in a solvent- or aqueous-based composition.

The feature that imparts a dominant attribute is included in the first layer 12. Usually, where the first layer 12 possesses the feature that imparts a dominant attribute, the second layer 13 excludes a feature that imparts the dominant attribute but includes a colorant that may be the same or different from that of the feature that imparts a dominant attribute. The layer containing the feature that imparts a dominant attribute should also include a photosensitive composition.

First Layer

The first layer having the dominant attribute includes a photosensitive composition, which is also, preferably, an aqueous liquid developable photosensitive composition for which exposure to actinic radiation results in a change in solubility.

Depending upon the imaging system in which the photosensitive element is used, the first layer may be prepared from aqueous- or solvent-based carriers.

The photosensitive composition can be photoinsolubilizable, i.e., before exposure the photosensitive composition is removable from the carrier support by, in an aqueous-based system, water or by aqueous solutions that consist essentially of water. After exposure, the aqueous photosensitive composition is not removable from the carrier support by water or by aqueous solutions that consist essentially of water. Alternatively, the photosensitive composition can be photosolubilizable. In this latter case, before exposure, the aqueous photosensitive composition is not removable from the support by water or by aqueous solutions that consist essentially of water. After exposure, the composition is removable from the support by water or by aqueous solutions that consist essentially of water.

Photoinsolubilization is generally achieved by photoinitiated polymerization and/or crosslinking reactions. The resulting change in physical properties of the compounds present, particularly the increase in molecular weight and/or network formation, insolubilizes the photosensitive material.

Derivatives of water soluble polymers, such as polyvinyl alcohol, which comprise pendant photocrosslinkable groups can be used to advantage in the first layer. On exposure these groups react to form crosslinks between different polymer chains. Photocrosslinkable polymers are described in A. Reiser, Photoreactive Polymers: The Science and Technology of Resists, Wiley, N.Y., 1989, pp 24–32. Typical photocrosslinkable groups are, for example, the cinnamyl, chalcone, alpha-phenylmaleimide, N-alkyl styrylpyridinium, and N-alkyl styrylquinolinium groups. Other aqueous developable systems are disclosed in Briney et al., U.S. Pat. No. 4,485,167.

Derivatives of polyvinyl alcohol which comprise photo-crosslinkable groups are preferred. Preferred polyvinyl alcohol derivatives are those which comprises N-alkyl styrylpyridinium or N-alkyl styrylquinolinium groups. Such polymers are described in K. Ichimura and S. Wantanabe, *J. Polym. Sci., Polym. Lett. Ed.,* 18, 613 (1980) and 20, 1411, 1419 (1982) as well as in U.S. Pat. Nos. 4,272,620, 4,287, 335, 4,339,524, 4,564,580 and 4,777,114.

Substituted aqueous-processable polyvinyl alcohol polymers are typically prepared by derivatization of saponified polyvinyl acetate with the appropriate photo-crosslinking group. It is desirable for the polyvinyl acetate to be at least 70% hydrolyzed. Typically 88% saponified polyvinyl acetate is used, but polyvinyl acetate which is more or less highly saponified can be used provided the first layer is aqueous-processable. The photocrosslinkable group can be attached to the polyvinyl alcohol by any appropriate chemical linkage, such as an ester, ether, or acetal linkage. The acetal linkage is preferred. Typically the 0.5–10 mol% photocrosslinkable groups, preferably 1–4 mol%, are present. Although polymers containing higher amounts of photocrosslinkable groups typically cannot be made to be aqueous-processable, higher amounts of photocrosslinkable groups can be used provided the first layer is aqueous-processable. The degree of polymerization of the polyvinyl alcohol, i.e., the number of monomer units in the polymer chain, is advantageously in the range of 400 to 3,000. When the polymerization degree is too low, the exposure time required for insolubilization is lengthened. When the polymerization degree is too large, the viscosity of solutions containing the polymer becomes so large that they are difficult to prepare and handle.

Polyfunctional photoactivatable crosslinking agents considered for this invention are bis-azides. These compounds are typically aromatic bis-azides substituted with one or more ionic groups, such as sulfonate, carboxylate, sulfate, etc., to increase water solubility. Typical bis-azides are sodium 4,4'-diazidostilbene-2,2'-disulfonate, sodium 4,4'-diazidobenzalacetophenone-2-sulfonate, and sodium 4,4'-diazidostilbene-alpha-carboxylate. A preferred bis-azide is sodium 4,4'-diazidostilbene-2,2'-disulfonate. As will be apparent to those skilled in the art, equivalent results may be obtained from the use of bis-azides which contain other cations in place of sodium, such as, for example, potassium, ammonium, and substituted ammonium, such as, for example, ethyl ammonium, tetramethyl ammonium, etc.

Photosensitive diazo resins are another class of photosensitive materials considered for this invention. These materials typically consist of aromatic diazonium salts crosslinked with formaldehyde. Representative materials are: the zinc chloride complex of the 4-(phenylamino)-benzenediazonium sulfate (1:1) formaldehyde polymer, the zinc chloride complex of the 4-(phenylamino)-benzenediazonium phosphate (1:1) formaldehyde polymer, the cobalt chloride complex of the 4-(phenylamino)-benzenediazonium (1:1) formaldehyde polymer, the uncomplexed 4-(phenylamino)-benzenediazonium phosphate (1:1) formaldehyde polymer, and the uncomplexed 4-(phenylamino)-benzenediazonium sulfate (1:1) formaldehyde polymer. Since their development does not produce effluent containing heavy metals, the uncomplexed 4-(phenylamino)-benzenediazonium phosphate (1:1) formaldehyde polymer and the uncomplexed 4-(phenylamino)-benzenediazonium sulfate (1:1) formaldehyde polymer are preferred.

Photosolubilization is generally achieved by photoinitiated conversion of materials to more soluble forms, plasticization reactions, depolymerization, uncoupling or uncrosslinking reactions. Systems based on o-quinone diazides and low molecular weight phenol-formaldehyde polymers can be used to advantage. Upon exposure to ultraviolet radiation, the o-quinone diazide is converted to the readily dissolved indene carboxylic acid. A discussion of such systems can be found in A. Reiser, Photoreactive Polymers: The Science and Technology of Resists, Wiley, N.Y., 1989, pp 178–225. Useful photosolubilization chemistry is also disclosed in Chen et al., U.S. Pat. No. 5,071,731.

The feature which imparts a dominant attribute is provided by a fluorescent material, a metallic material, and an opacity enriching material and combinations of two or more of such materials. It has been found that when a dominant attribute is added to the first layer 12 an additive effect is achieved with the adjacent colored layer which, typically, excludes a feature which imparts a dominant attribute, so that the overall attribute of the final image is defined by the dominant attribute of the first layer.

Some suitable examples of fluorescent materials include Cerise® CE 3026 fluorescent pink (McGruder Co.), Sunbrite® Magenta 251-TS-52 fluorescent Magenta, Sunbrite® Chartreuse 256-TS-41 fluorescent yellow, Sunbrite® Orange 257-2516 fluorescent red orange (all from Sun Chemical Corporation), and Aurora Pink SF1-11B (from DayGlo Corporation). The fluorescent hue of fluorescent materials can be observed under ultraviolet light irradiation. Suitable examples of metallic materials include Brilliant Fire # B-13 copper from Bronze Powder Co.; Infagold 50 Palegold from Obron Co., Paines, Ohio; and pearlescent mica based materials that through addition of process pigments can simulate a metallic feature. Pearlescent pigments include Mearling® Satin White, Mearlin® Golden Bronze, Mearlin® Mayan Gold, all from Engelhard Industries.

Metallic material is distinguished by the presence of metallic luster. This feature can be observed by viewing the reflectance color of the metallic surface at different angles. Since metallic surfaces as well as surfaces of nacreous (nonmetallic) materials are very smooth they have very high specular reflection which is highly directional. When viewed at the angle of highest specular reflection the metallic appearance or luster is most evident. Viewed at other angles one sees only the inherent color of the metallic or nacreous material which is generally much more dull in appearance. This is true of printed materials made with true metallic flake pigments such as aluminum flakes or made with nacreous or pearlescent pigments containing pigments comprised of mica or lead carbonate, the latter two pigments occurring as natural materials in platelet form. It is the reflection from the highly aligned surface or platelets which give the metallic-like reflectance or luster. The latter is often called nacreous luster (Pigment Handbook, Volume 1, Properties and Economics, Second Edition, Edited by Peter A. Lewis, John Wiley and Sons, Inc. 1988, written as Mearl Technical Bulletin Number 2 by L. M. Greenstein). The exact directional nature of the reflectance can be demonstrated using a goniometer which measures the reflectance as a function of the viewing angle. In addition a Leres Goniospectrophotometer is suitable to measure reflectivity and therefore metallic luster of metallic and pearl escent materials (Mearl Technical Bulletin Number 1, written by L. Armanini, the Mearl Corporation, 1987). Armanini cites numerous technical results obtained by this method at the Mearl Corporation (now Englehard Industries).

Where the feature which imparts a dominant attribute is an opacity enriching feature, portions of the first layer may be provided an amount of opaque material to alter the opacity or a higher concentration of the colorant is used if the feature is for color saturation.

Other conventional additives can also be added to the first layer provided they are compatible with the other ingredients present in the layer, do not impart unwanted color to the final image, and do not adversely affect the action of the element required for the operation of either the imaging process or the multiple transfers required to transfer the image to a permanent support. In some cases separate photoinitiators are added. Other components can include, for example, polymeric binders, plasticizers, antihalation agents, optical brightening agents, release agents, surfactants, coating aids, matting agents, and the like.

Additives may be included in the photosensitive composition to improve the colorant-containing composition's penetration, absorption and/or fixation to the first layer. Fine particles, up to 1 mil (2.54 $\mu$) in size, such as silica, alumina, calcium carbonate, etc., may be added to the layer to improve its permeability. When the aqueous colorant containing composition contains an anionic dye or anionic pigment dispersant, cationic resins may be added to fix the colorant by an ion exchange reaction. Anionic resin additives are used when the dye and pigment dispersant are cationic. Matting agents added to the first layer would be expected to provide a matte appearance to the layer.

The photosensitive material should be present in the first layer in sufficient amount to solubilize or insolubilize the first layer (depending upon whether it is right or wrong reading) on exposure to actinic radiation. The photosensitive composition should contain sufficient polymer, either as part of the photosensitive material and/or as added binder, to form a film when coated to form the first layer. The feature which imparts a dominant attribute is present in the amount of about 30 to about 60% by weight, preferably about 40 to about 50% by weight, based on the weight of the first layer. Other ingredients may be present in amounts necessary to achieve their desired purposes, but not in such large amounts that they adversely affect the properties of the imaging system.

The composition of the first layer, expressed in percent by weight, based on the total weight of the first layer, is typically: binder about 40–50%, preferably about 45–about 49%; photosensitive material about 2–about 10%, preferably about 2–about 6%, feature which imparts a dominant attribute about 30–about 60%, preferably about 40–about 50%, and other ingredients about 0–about 10%. If no binder is present, i.e., the photosensitive material also functions as a binder, the composition is typically: photosensitive material about 30–about 60%, preferably about 45–about 55%; dominant attribute about 30–about 60%, preferably about 40–about 50%; and other ingredients about 0–about 10%.

The first layer generally has a thickness in the range of about 0.1 to about 10 micrometers; preferably about 0.5 to about 2 micrometers.

Second Layer The second layer (13) may be applied as a coating or laminated as a sheet layer and contains a first colorant. A portion of the colorant-containing composition may be absorbed into the first layer after application. The second layer must have properties which permit solvent (e.g. water in aqueous systems) to reach the first layer for removability before or after exposure. For this reason the second layer is usually solvent permeable, typically aqueous permeable. In some instances the second layer is solvent soluble, typcially aqueous soluble.

When the first layer is aqueous permeable, the colorant-containing composition should also be aqueous permeable so as not to interfere with the development of the first layer after exposure. If present as a layer over the first layer, its thickness should be no greater than about 4 micrometers, preferably no greater than about 2 micrometers. The colorant-containing composition may be photosensitive or non-photosensitive. One advantage of the colorant-containing layer being photosensitive is that it would be imaged along with its adjacent first layer during the imaging step. This would improve the durability of the colored image during the washing step. Where the colorant-containing composition is photosensitive the same photosensitive composition in the first layer may be used.

The colorant of the second layer may be a material that is insoluble in the preferably aqueous liquid used to develop the exposed first layer. The colorant can be one of the four standard colors, i.e., yellow, magenta, cyan, and black, or any other desired color. The colorants which can be used are well known to those skilled in the art. The colorant should be compatible with the components in the first layer and preferably if the second layer contains a photosensitive composition the colorant should not strongly absorb radiation in the spectral range in which the photosensitive composition absorbs radiation. Preferred colorants are pigments which are dispersible in water. Dyes may also be useful colorants.

The colorant should be present in a sufficient amount in the colorant containing composition to uniformly color the image to a sufficient optical density, but not in such a large amount that if it were absorbed into the first layer after its application, would adversely affect the properties of the first layer, for example, photospeed, adhesion, etc., needed for the operation of the imaging system. For surprint proofs, optical densities between 0.5 and 2 are desirable. Other ingredients may be included in the colorant-containing composition to improve its penetration, absorption and or fixation to the first layer provided they do not adversely affect the first layer's imaging function or the colorant's desired color. Water insoluble binders may be present in the preferred aqueous permeable colorant-containing composition to improve coatability and/or water-fastness of the image.

To form the second layer, the colorant-containing composition (13) may be coated, laminated, sprayed or printed onto the first layer. In one embodiment, the preferably aqueous permeable colorant-containing composition (13) is an ink jet ink and is applied using an ink jet printer. The ink jet ink comprises an aqueous carrier medium and a colorant which may be a pigment dispersion or a dye. If the colorant is a dye, it should be rendered insoluble by known techniques, e.g. encapsulation, so it is not washed away in the development step. Reactive dyes that are capable of reacting with the photosensitive material upon exposure to UV radiation are also useful in this invention. A dye dispersion may also be used. The pigment dispersion comprises a pigment and a dispersing agent, which preferably is a polymeric compound. Suitable pigment based ink jet inks are disclosed in U.S. Pat. No. 5,085,698.

Any material that would provide swelling of the first layer without having a deleterious effect on it would be useful for improving diffusibility (where diffusibility is desirable) of the colorant containing composition into the first layer, e.g. water, surfactants, etc. Surfactants alter surface tension and would therefore be expected to maximize penetration of the colorant containing composition into the first layer. However, they may also destabilize the pigment dispersion for pigment containing compositions. The choice of a specific surfactant is also highly dependent on the type of photosensitive composition on the first layer of the photosensitive element to be printed. One skilled in the art can select the appropriate surfactant and the appropriate amount for a specific element to be printed. Thermal crosslinking agents may be added to the colorant containing composition or the first layer to improve adhesion of the colorant containing composition to the first layer and prevent it from being washed off during the development step.

Biocides, sequestering agents such as EDTA, humectants, viscosity modifiers, and other acrylic or non-acrylic polymers may also be added to improve various properties of the colorant containing composition.

For ink jet applications, the colorant containing composition has physical properties compatible with a wide range of ejecting conditions, i.e., driving voltage, driving frequency, and pulse width for thermal ink jet printing devices, driving frequency for the piezo element for either a drop-on-demand device or a continuous device, and the shape and size of the nozzles, etc. The colorant containing composition may be used with a variety of ink jet printers such as continuous, piezoelectric drop-on-demand, and thermal drop-on-demand, and are particularly adapted for use in thermal ink jet printers. The colorant containing compositions have excellent storage stability for a long period and do not clog the nozzles. Drying of the colorant containing compositions on the first layer or on the single-sheet film can be carried out rapidly and accurately by means known to those skilled in the art.

Support Elements

Figure 2:
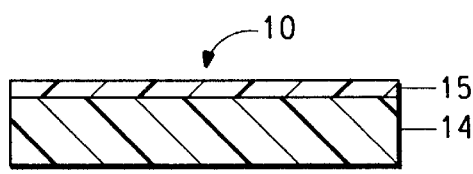
FIG. 2 is a cross-section of an alternative support element useful in the process of the invention.

The support element (10) may have a release surface (not shown), or, shown in FIG. 2, may include a carrier support (14) and a surface layer (15) which may be a layer having release properties or a layer having cushioning properties. If the material used as the carrier support has a release surface, e.g., polyethylene or a fluoropolymer, no additional surface layer is needed. The surface layer (15) should have sufficient adhesion to the carrier support (14) to remain affixed to that support throughout all the process steps in the processes of the invention. The surface layer should have sufficient adhesion to the optional adhesive layer (11) to remain affixed thereto during development of the first layer. But at the same time, the adhesion of the surface layer to the adhesive layer (11) should be low enough to allow for removal of the carrier support and the carrier surface layer, if present, subsequent to the development steps. The relative adhesion balances will be discussed in greater detail below.

In either single color imaging process or expose-in-register multicolor imaging process, the support element serves as a temporary receptor upon which the colored image having a dominant attribute, comprising one or more imaged colored layers interleaved with adhesive layers, can be constructed. The first layer with its overlying colorant-containing composition is exposed and developed while on the carrier element.

The carrier support (14) can comprise almost any material which has reasonable stiffness, has dimensional stability, and is water resistant. Materials with sufficient stiffness and dimensional stability are those which are capable of supporting an image without allowing it to shift and misalign. The material used for the carrier support should have enough water resistance to allow for development of the first layer composition without warping or shrinking. The material used for the carrier support should also have sufficient heat and pressure resistance to withstand the various lamination steps. The support is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The carrier support can also be a thin metal sheet or a paper substrate or synthetic paper which has been treated to be water resistant. The carrier support can be transparent, translucent or opaque. It can be colored and can have incorporated within materials such as antihalation dyes, etc. A preferred carrier support material is polyethylene terephthalate film.

The carrier support (14) can have an antistat layer coated on one or both sides. This can be useful in reducing static when the carrier support is removed from the photosensitive element by peeling off, as will be discussed below. It is generally preferred to have an antistat layer coated on the back side of the carrier support, i.e., the side opposite from that on which the first layer is present. Materials which can be used as antistat materials are well known in the art.

The carrier support typically has a thickness of about 20 to about 250 micrometers (1.0 to 10 mils). A preferred thickness is about 55 to about 200 micrometers (about 2 to about 8 mils).

The surface layer (15) which is selected from the group consisting of (i) a release layer and (ii) a cushion layer. Release layers are generally very thin layers which promote the separation of layers. Materials useful as release layers are well known in the art and include, for example, silicones; melamine acrylic resins; vinyl chloride polymers and copolymers; vinyl acetate polymers and copolymers; plasticized polyvinyl alcohols; ethylene and propylene polymers and copolymers; etc. When a separate release layer is coated onto the carrier support, the layer generally has a thickness in the range of about 0.5 to about 10 micrometers.

When the surface layer is a release layer it may also include materials such as antistats, colorants, antihalation dyes, optical brighteners, surfactants, plasticizers, coating aids, matting agents, and the like.

A second, and preferred, type of surface layer (15) is a cushion layer having a release surface. The cushion layer is a deformable layer which is generally thicker than a release layer. Surprisingly, it was found that the incorporation of a cushion layer on the carrier support resulted in several advantages in the process of the invention when forming multicolor images: the amount of mottle caused by incorporation of entrapped air during lamination steps was greatly reduced; lamination temperatures could be reduced; and the adhesion between colors was improved.

The cushion layer should have a release surface to allow for separation of the carrier support and cushion layer from the adhesive layer subsequent to development of the first layer composition. Some examples of suitable materials which can be used as the carrier cushion layer include ethylene/methacrylic acid copolymers and ionomers; ethylene/acrylic acid copolymers and ionomers; ethylene/vinyl acetate copolymers; ethylene homopolymers; propylene homopolymers; ethylene/propylene copolymers; ethylene/methacrylate copolymers; ethylene/methacrylic acid/isobutylacrylic acid ionomers; and the like. Mixtures of materials can also be used. Preferred materials for the carrier cushion layer are ethylene/methacrylic acid and ethylene/acrylic acid copolymers and ionomers. Such materials are commercially available as, e.g., Surlyn® 1601 (E.I. du Pont de Nemours and Company, Wilmington, Del.) and Iotek® 4080 (Exxon Chemical Co., Houston, Tex.).

The cushion layer may also include materials such as antistats, colorants, antihalation dyes, optical brighteners, surfactants, plasticizers, coating aids, and the like. In general, these additional materials may constitute less than about 10% by weight, based on the total weight of the carrier cushion layer; preferably less than about 5% by weight. It can be advantageous to include a white pigment in the carrier cushion layer. This facilitates inspection of the colored image formed thereon.

The cushion layer generally has a thickness in the range of about 12 to about 150 micrometers (about 0.5 to about 6 mils); preferably about 35 to about 65 micrometers (about 1.4 to about 2.6 mils).

In order to ensure adequate adhesion of the cushion layer to the carrier support, it is sometimes necessary to include one or more anchor layers between them. By "anchor layer" it is meant a layer that remains adhesively bonded to the layers on both sides, i.e., the layer above it and the layer below it. Adhesive materials for bonding different types of materials are well known in the art and discussions can be found in, e.g., Handbook of Adhesives, 2nd Edition, Irving Skeist, Ed. (Van Nostrand Reinhold Co., New York, 1977). Any conventional adhesive materials can be used in the anchor layer or layers so long as they are not adversely affected by the development step. Suitable materials for use as the anchor layer include, for example, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the cushion layer and the carrier support. The anchor layer or layers can have incorporated therein materials such as antistats, colorants, antihalation dyes, optical brighteners, surfactants, plasticizers, coating aids, and the like.

The anchor layer generally has a thickness in the range of about 0.01 to about 10 micrometers; preferably about 0.05 to about 5 micrometers. When more than one anchor layer is present, the total thickness of the layers is generally in the above range.

The support element may also be provided with a temporary coversheet (not shown). The temporary coversheet can comprise any material which affords adequate protection of the underlying adhesive layer and which cleanly releases from the adhesive layer by peeling. Preferred coversheets are self releasing films, such as polyethylene or polyethylene terephthalate. These films can be coated with release layers, such as silicone, so long as the release layer is removed cleanly with the film. The thickness of the temporary coversheet is not critical and typically is in the range of 25 to 250 micrometers (1 to 10 mils).

Adhesive Layer

The adhesive layer (11), when present, remains affixed to layer 12 throughout the process of the invention. This adhesive layer can be comprised of any suitable composition which has the necessary adhesion to the first layer and which does not interfere with the function of the first layer, such as, for example, that interference which might result from the leaching of components from the adhesive layer into the first layer or the resulting imaged layer. To provide a high resolution image, it is preferred that the adhesive layer be capable of holding onto a dot during processing; not stain the colorant containing layer; and not block to other layers, e.g. paper, etc., both during and after proof assembly. Preferably, the adhesive layer is transparent and does not have any yellowness which may shift the color balance. It should be capable of easy lamination without trapping air bubbles which reduce image quality. It is preferred that the adhesive layer be capable of sliding easily over other layers, but not so easily that registration problems occur. The adhesive layer should, preferably, heat seal to other color films and adhesive layers, be scratch and abrasion resistant, in wet or dry form, and not crack or become brittle over time, or when folded, bent, etc. Sticking to components of the lamination or processing equipment is also undesirable.

As discussed above, adhesive materials for bonding different types of materials are well known in the art and discussions can be found in, e.g., Handbook of Adhesives, 2nd Edition, Irving Skeist, Ed. (Van Nostrand Reinhold Co., New York, 1977). The exact choice of adhesive will depend on the nature of the first layer, the carrier support and the release or cushion layers. Examples of some suitable types of adhesives which can be used include polyester resins and vinylacetate copolymers with ethylene and/or vinyl chloride.

Conventional additives listed earlier as additives for the cushioning and release layers may also be present in the adhesive layer.

The adhesive layer (11) generally has a thickness in the range of 0.1 to 10 micrometers; preferably 0.5 to 3 micrometers.

Preparation of the Photosensitive Element

The photosensitive element may be made by providing all of the layers onto a support element 10. The component layers, for example layers 12 and 13, may be applied using any conventional coating and/or lamination techniques. Where either of the first layer or the second layer are aqueous based, the coating can be applied using a Waterproof® Color Versatility Coater, sold by DuPont.

If the optional adhesive layer 11 is coatable from a solution, the component layers may be coated on the temporary support (not shown) and laminated to the support element 10. In such a case the temporary support may have a matte finish on its surface adjacent a layer (such as a layer containing photosensitive composition) to impart a matte finish to the first layer when the temporary support is peeled off.

It is frequently convenient to prepare the photosensitive element by laminating together a preformed element to a carrier element. The preformed element may comprise the first layer containing photosensitive composition and the adhesive layer sandwiched between a temporary coversheet (not shown) and a temporary support (not shown).

The optional temporary coversheet is present to protect the element from being scratched or otherwise damaged prior to use. The temporary coversheet can be selected from the same materials described for the temporary coversheet in the carrier element.

The temporary support can comprise any dimensionally stable sheet material. Typically a polymeric film is used.

The temporary support should be removable from the first layer prior to exposure to actinic radiation. At the same time, there should be sufficient adhesion between the first layer and the temporary support to allow for manufacture and handling of the photosensitive element. A separate release layer can be situated between the temporary support and the first layer, or a silicone release-treated film can be used. It is preferred to use a release layer. This allows for adjustment of the adhesion force between the first layer and the temporary support with respect to the other important adhesion forces which influence the process of the invention, as will be discussed in detail below.

The thickness of the temporary support should be sufficient to impart the necessary stiffness for handling and dimensional stability, but beyond that it is not particularly critical. The thickness is generally in the range of about 25 to about 250 micrometers (about 1 to about 10 mils).

Preferably, the element having a temporary support and a temporary coversheet is prepared by coating each of the individual layers onto the temporary support. Preferably, the first layer is prepared by suspending or dissolving the ingredients in an appropriate solvent, preferably aqueous; coating onto the temporary support; and evaporating the solvent.

The photosensitive element shown in FIG. 1 may be prepared from the preformed element and the carrier element by laminating the two together. The two temporary coversheets are first removed and the two elements placed together such that the adhesive layer (11) is adjacent to the support element (10). The temperature and pressure used in the lamination step will depend on the composition of the adhesive layer (11) and the support element (10). The temporary support is then peeled off. When a release layer is present between the temporary support and the first layer, the release layer will be peeled off with the temporary support and will not remain on the first layer.

It will be clear to those skilled in the art that in order to remove the two temporary coversheets, the adhesion force between each of the temporary coversheets and their adjacent layers should be lower than the adhesion forces between all the other layers in their respective elements. It will also be clear that in order to remove the temporary support and the associated release layer, if present, after the lamination step, the adhesion force between the first layer and the temporary support or the release layer, if present, should be lower than the adhesion force between the first layer (12) and the adhesive layer (11), and the adhesion force between the adhesive layer (11) and the carrier element (10).

Image Formation Process

The photosensitive element having an overall attribute may form a proofing image.

A single-color image or a multicolor image may be formed using the photosensitive element. A single-color image can be formed using any conventional process. For example, the image formation process may include a image-transfer intermediate step. Alternately, the image-formation process may include exposure directly on a final substrate, such as a permanent support and therefore excludes the image-transfer intermediate step.

Similarly, a multi-color image can be formed using any conventional process. In preparing a multicolor image, the first colored image is prepared using a photosensitive element having a feature that imparts a dominant attribute. All subsequent colored images can be prepared using photosensitive elements that may be unpigmented and may not have a feature that imparts a dominant attribute.

Figure 3:
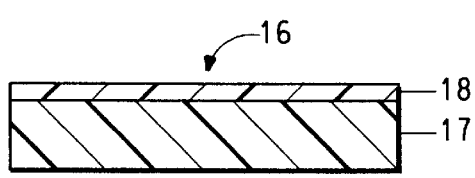
FIG. 3 is a cross-section of a first transfer element.
Figure 4:
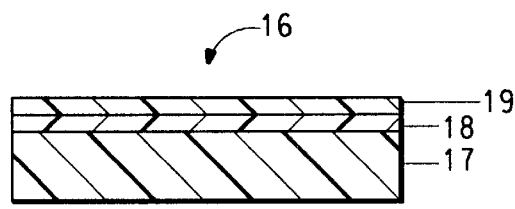
FIG. 4 is a cross-section of a second transfer element.

For example, a single colored image on a permanent support can be formed by applying at least one colorant-containing composition to a photosensitive element comprising a support element having a release surface, a first adhesive layer, and a first layer having a feature that imparts a dominant attribute consisting essentially of an aqueous liquid developable photosensitive composition and wherein the colorant-containing composition is applied to the first layer; imagewise exposing to actinic radiation the photosensitive element having applied thereon colorant-containing composition to form imagewise exposed and unexposed regions in the first layer having the feature that imparts a dominant attribute and the overlying colorant-containing composition; developing the exposed element by washing with an aqueous liquid, thereby removing either the imagewise exposed or imagewise unexposed regions, to produce a first, typically, colored pattern having a dominant attribute made up of the developed first layer (12) and overlying colorant containing composition (13); laminating to the exposed and developed element a transfer element as shown in FIGS. 3 and 4 having a release surface (not shown), wherein the release surface is adjacent to the first colored pattern having a dominant attribute (see FIG. 5); removing said support element having a release surface, revealing the optional adhesive layer; laminating the element so formed to a permanent support, wherein the adhesive layer is adjacent to the permanent support (see FIG. 6); and removing the transfer support having a release surface.

In addition, a support element is used to build up a multicolored image having a dominant attribute consisting of multiple imaged color layers, each interleaved and bonded together with an adhesive layer. Multiple color images having a dominant attribute are built up on the carrier element by executing multiple imaging steps, respectively. After the multicolored image has been formed, a transfer element is employed to effect a double transfer of the multicolored image, ending with transfer of the colored image having a dominant attribute from the transfer element (which image is wrong-reading) to the permanent support to afford a right-reading image. This process of forming a multicolored surprint proof is called an expose-in-register process.

Alternatively, a multicolored surprint proof is formed by exposing and developing at least one additional photosensitive element comprising a support element having a release surface, an adhesive layer and a first layer, and which has applied thereon at least one aqueous permeable colorant-containing composition, laminating in register the so formed colored image to a transfer element having a first colored image having a dominant attribute thereon, followed by removal of the carrier element having a release surface and lamination of the so formed multicolor image having a dominant attribute to a permanent support. This process of forming a multicolored surprint proof is called a laminate-in-register process.

Where an intermediate image-transfer step is used to form the image, a transfer element as shown in FIGS. 3 and 4 is used. The function of the transfer element having a release surface is to serve as a temporary receptor to receive the colored image after it has been formed on the support element and to provide adequate support for the image to maintain its integrity until it has been transferred to a permanent support.

Representative transfer elements are shown in FIGS. 3 and 4. As shown in FIG. 3, the first transfer element may comprise, in order, an optional temporary coversheet (not shown), a transfer surface layer (18), and a transfer support (17). Optionally, as shown in FIG. 4, the transfer element may comprise a transfer support (17) and two transfer surface layers (18) and (19). However, if a material having a release surface is used as the transfer support (e.g. polyethylene or a fluoropolymer) no additional release layer is needed.

The transfer support (17) may comprise almost any material which has reasonable stiffness and dimensional stability. Materials with sufficient stiffness and dimensional stability are those which are capable of supporting an image without allowing it to shift and misalign. The support is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The transfer support can also be a thin metal sheet or a paper substrate or synthetic paper. A preferred transfer support material is polyethylene terephthalate film. The transfer support typically has a thickness of about 20 to about 250 micrometers (about 1.0 to about 10 mils). A preferred thickness is about 75 to about 200 micrometers (about 3 to about 8 mils).

The transfer surface layers (18) and (19) are selected from the group consisting of (i) a release layer and (ii) a cushion layer. The transfer surface layer (18) should have sufficient adhesion to the transfer support to remain affixed to that support throughout all the process steps in the process of the invention. At the same time, the adhesiveness of the transfer surface layer should be carefully balanced with the adhesiveness of the surface layer of the support element in order to carry out the transfer steps in the process of the invention. The relative adhesion balances will be discussed in greater detail below.

In the embodiment wherein the transfer support (17) has two layers thereon, adhesion of the layer (18) adjacent the support (17) may be greater than its adhesion to layer (19). Layer (19) may have greater adhesion to the developed first layer (12') having thereon the overlying colorant-containing composition (13') so that when the transfer support is peeled off, layer (18) is removed with the support and layer (19) is left behind. The two layer transfer element may also be designed wherein both layers have greater adhesion to the support (17) than the developed first layer (12') having thereon the overlying colorant-containing composition (13') so that when the transfer support (17) is peeled off both layers (18) and (19) are removed with it. The two layer transfer element may also be designed wherein both layers have greater adhesion to the developed first layer (12') having thereon the overlying colorant-containing composition (13') than the transfer support (17) so that when the transfer support (17) is peeled off both layers (18) and (19) are left behind on the developed first layer (12') having thereon the overlying colorant-containing composition (13').

As discussed above in conjunction with the surface layer of the support element, release layers are generally very thin layers which promote the separation of layers. Materials useful as release layers are well known in the art. Release layers discussed earlier with regard to the support element are also useful in the transfer element as long as the adhesion balances are met. The release surface may constitute the transfer surface layer (18) or transfer surface layers (18) and (19). When a separate release layer or layers are coated onto the transfer support, the layer(s) generally has a thickness in the range of about 1 to about 10 micrometers.

The preferred type of transfer surface layer is a cushion layer having a release surface. As with cushion layer for the support element, when the transfer surface layer has cushioning properties it is a deformable layer which is generally thicker than a release layer.

When the transfer surface layer has cushioning properties, it should have a release surface to allow for separation of the transfer support and the transfer surface layer from any temporary coversheet, and from any layers which are subsequently laminated to the transfer surface layer. As mentioned above, the composition of the transfer surface layer should be chosen so as to produce the appropriate adhesiveness relative to the release surface of the surface layer of the support element especially if the surface layer has cushioning properties. Examples of some suitable cushion materials which can be used as the transfer surface layer include ethylene/vinyl acetate copolymers; ethylene/methacrylic acid copolymers and ionomers, generally having a higher methacrylic acid content than when used as a cushion material for the support element; ethylene/acrylic acid copolymers and ionomers, generally having a higher acrylic acid content than when used as a cushion material for the support element; ethylene/methacrylate copolymers; ethylene/methacrylic acid/isobutylacrylic acid ionomers, generally having a higher methacrylic acid and isobutylacrylic acid content than when used as a cushion material for the support element; and the like. Mixtures of materials can also be used. Preferred materials for the transfer cushion layer are ethylene/vinyl acetate copolymers. The transfer surface layer can also include materials such as surfactants, plasticizers, coating aids, and the like. In general, colorants, antihalation dyes, optical brightener, etc., are not used in the transfer surface layer as they serve no added purpose in this layer.

The transfer surface layer, when a cushion layer, generally has a thickness in the range of about about 25 to about 150 micrometers (about 1 to about 6 mils); preferably about 75 to about 125 micrometers (about 3 to about 5 mils).

In order to ensure adequate adhesion of the transfer surface layer to the transfer support, it is sometimes necessary to include one or more anchor layers between them. Adhesive materials for bonding different types of materials are well known in the art and discussions can be found in, e.g., Handbook of Adhesives, 2nd Edition, Irving Skeist, Ed. (Van Nostrand Reinhold Co., New York, 1977). Any conventional adhesive materials can be used in the anchor layer or layers. Suitable materials for use as the transfer anchor layer include, for example, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the transfer surface layer and the transfer support. The anchor layer or layers can have incorporated therein materials such as antistats, colorants, surfactants, plasticizers, coating aids, and the like.

The transfer anchor layer generally has a thickness in the range of about 0.1 to about 10 micrometers; preferably about 0.5 to about 2 micrometers. When more than one anchor layer is present, the total thickness of the layers is generally in the above range.

An optional temporary coversheet is present to protect the underlying layers, if necessary, and should be easily removable. It can be selected from any of the materials discussed above that are useful as the temporary coversheet for the support element.

Permanent Support

Almost any material which will adhere to the adhesive layer (11) can be used as the permanent support. Thus, for example virtually any paper stock can be used. Other materials which can be used as the permanent support include cloth, wood, glass, china, ceramics, most polymeric films, synthetic papers, thin metal sheets or foils, etc.

Process Steps

The process of the invention may be used to produce a single color image having the dominant attribute on a permanent support or it may be used to make a multicolor image having the dominant attribute on a permanent support using either the exposure-in-register process or the laminate-in-register process. A description of a preferred single-color image formation process is described for illustration purposes.

Single Color Image

Figure 5:
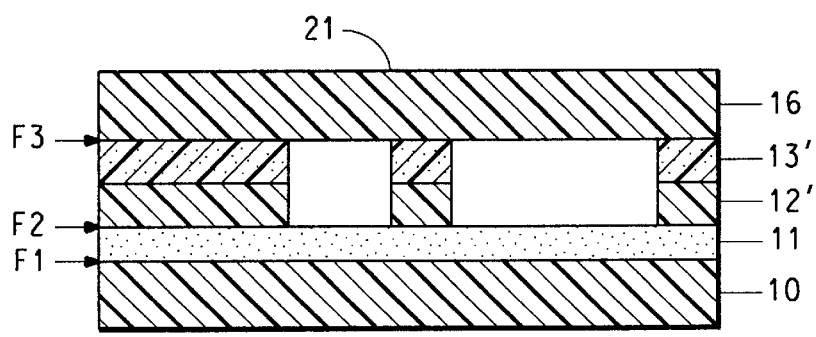
FIG. 5 is a cross-section of an intermediate imaged element obtainable from the process of the invention.

In the process of producing a single color image on a permanent support, the colored image having the dominant attribute is first built up on the support element 10 by exposing and developing by washout, a first layer having a dominant attribute (12) having provided thereon a second layer comprising, typically, at least one colorant-containing composition (13), a transfer element having a release surface (16) is laminated thereto resulting in the composite shown in FIG. 5. The support element 10 is peeled off and the resulting composite is laminated to the permanent support (20) resulting in the composite of FIG. 6.

Step A: The element shown in FIG. 1 is prepared by applying as layer (13) at least one, colorant-containing composition excluding a dominant attribute to layer (12) which is a photosensitive element having a feature which imparts a dominant attribute comprising, in order, a support element having a release surface (10), an adhesive layer (11), a first layer comprising a first layer composition and containing a feature which imparts a dominant attribute (12), wherein the colorant-containing composition is adjacent to the first layer (12). The colorant-containing composition may be applied by coating, spraying, laminating or printing. Preferably, the colorant-containing composition is printed using an ink jet printer or coated using a coating device. Advantages of the invention are that the colorant-containing composition need not be applied to the whole surface of the first layer and more than one colorant-containing composition can be applied to the first layer. The colorant-containing composition need only be applied in the approximate areas where an image is to be formed in Steps B and C.

Step B: The element shown in FIG. 1 is exposed to actinic radiation which is absorbed by the photosensitive composition of the first layer (12) to activate the imaging reaction in conventional fashion.

"Actinic radiation" is any radiation which produces imaging. The radiation can be natural or artificial, monochromatic or polychromatic, incoherent or coherent. For efficient image formation, most of the actinic radiation should be absorbed by the photosensitive material. The absorption spectrum of the photosensitive material may be determined by conventional spectrophotometry.

Conventional sources of actinic radiation that may be selected include fluorescent, mercury vapor, mercury-xenon, metal additive, and arc lamps. Useful sources of coherent radiation, such as lasers whose emissions fall within or overlap the absorption bands of the photosensitive composition, may also be used. Exposure is ordinarily carried out through a halftone image-bearing transparency, preferably a halftone color separation transparency. However, other means, such as a modulated scanning laser beam, CRT (cathode ray tube), and the like, may be used to imagewise expose the photosensitive elements.

The element is exposed to actinic radiation, typically through a separation transparency, with the emulsion side of the transparency in contact with the colorant-containing composition on the first layer, or the first layer if the aqueous permeable, colorant-containing composition is absorbed into the first layer. Exposure is typically carried out in a standard vacuum frame to ensure good contact between the transparency and the first layer element.

Step C: The next step is to develop the first layer image by washing the photosensitive element with an aqueous liquid. When the photosensitive composition of the first layer is photoinsolubilizable, the aqueous liquid removes only the unexposed areas of the first layer and the overlying colorant-containing composition. When the first layer is photosolubilizable, the aqueous liquid removes only the exposed areas of the first layer and the overlying colorant-containing composition. As a result of the development step, an imaged element comprised of a developed first layer (12') and an overlying colorant-containing composition (13') shown in FIG. 5 is formed.

It is preferred that the development step be effected using ordinary tap water or the like to minimize concerns regarding toxicity, waste treatment, and corrosion. Development can either be done manually or using automated machines. It can be carried out at elevated temperatures, but in most cases room temperature is preferred.

Step D: The next step in the process is to laminate the transfer element (16), shown in FIGS. 3 and 4, to the intermediate imaged element, as shown in FIG. 5. A temporary coversheet, if present, is removed and the two elements are laminated together such that the transfer surface layer (18) in FIG. 3, transfer surface layer (19) in FIG. 4 or a transfer element having a release surface (not shown) is adjacent to the first colored pattern, i.e., the developed first layer and its overlying colorant-containing composition comprised of (12') and (13') as illustrated in FIG. 5.

The resulting element, called the intermediate imaged element (21), has the structure shown in FIG. 5. It will be clear to those skilled in the art that, in order to achieve proper image transfer, the adhesion balance of the various component layers should be adjusted such that the adhesive forces at the temporary transfer interfaces are less than those at the permanent adhesive interface. Thus, for example, the adhesion forces between the individual layers should have the following values:

F1=the adhesion force between the support element (10) and the adhesive layer (11);

F2=the adhesion force between the adhesive layer (11) and the developed first layer (12');

F3=the adhesion force between the first layer (12) together with the colorant-containing composition (13') first layer and the transfer element having typically a release surface (16);

Step E: The next step in the process is to remove the support element (10). Thus the image is transferred to the transfer element. This step is accomplished by peeling the support element. In order to obtain the desired result, the adhesion values F2 and F3 should each individually be greater than the adhesion value F1.

Figure 6:
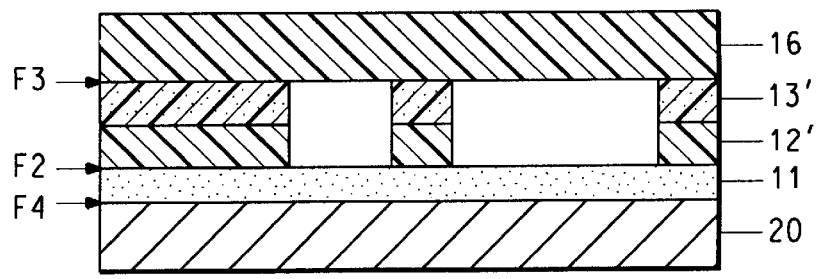
FIG. 6 is a cross-section of a first composite element including the imaged intermediate element of FIG. 5 placed on a permanent support prior to removal of the transfer element.

Step F: The next step in the process is to laminate the permanent support (20) to the intermediate imaged element (21), such that the permanent support (20) is adjacent to the adhesive layer (11) as illustrated in FIG. 6. The adhesion force between the permanent support (20) and the adhesive layer (11) has a value F4.

Step G: The next step in the process is to remove the transfer element having (16), thereby transferring the image to the permanent support. This step is accomplished by peeling the transfer support and the permanent support apart. In order to obtain the desired result, the adhesion values F2 and F4 should each individually be greater than the adhesion value F3.

Multicolor Image Formation

A polychiromatic image can be formed by using more than one colored photosensitive element in, for example an expose-in-register process or a laminate-in-register process. Further details of these processes are described in U.S. Pat. No. 5,616,439.

The photosensitive element obtainable from this invention are useful for preparing colored images. These images are particularly useful in the graphic arts field, especially in the area of color proofing wherein proofs are prepared to predict the images produced by printing.

The advantageous properties of this invention can be observed by reference to the following examples, which illustrate, but do not limit, the invention.

EXAMPLES

The physical properties listed below were measured in the following ways: Density was measured with a Gretag Model SPM 100-1 Spectrosensor.

Resolution is generally measured using a microline target or a target made up of different screen rulings. A series of exposures is made using the UGRA Wedge 1982. The part of the wedge used is the microline portion. The exposure selected is that where the reproduction of both the positive and negative microlines starts in the same wedge segment. The number of this segment indicates the resolution in terms of micrometers. Resolution is also a measure of the degree of detail of the printing expected from the film. High resolution gives great detail, low resolution will lack detail.

%Dots is a measure of the dot range of the film. The dot range at a particular screen ruling (200 lpi, in these examples) provides a measure or indication of the degree of highlight detail(0.5–5%) and shadow detail(95–99.5%) that a film will give. A large dot range is more desirable for finely detailed prints from proofed films.

The UGRA and COM GUIDE targets contain highlight and shadow microline elements at 0.5%, 1.0%, 2%, 3%, 4%, 5%, 95%, 96%, 97%, 98%, 99% and 99.5%.

Dot gain(spread) at 50% is a measure of the change in dot size(spread) at 50%. Dot gain can occur from the photooptical effects of exposure through the target and film in proofing. Dot gain in printing can occur from spreading of the dots from the ink wetting the paper or printing surface. The most accurate simulation of proofs to press occurs when the proof dot gain is essentially equal to that of the press. Excessively high dot gain can limit the resolution and the printing detail.

DuPont COM GUIDEs were developed by Felix Brunner of System Brunner Switzerland as control strips to monitor exposure, dot range, resolution, color balance and ink traping for proof making, plate exposure and other graphic arts applications. They measure 1 inch (2.54 cm.) by 5 inches (12.7 cms.) in size. They were originally developed for use with Cromalin® but are now used in a wide range of graphic arts products including Waterproof®. Exposure of a Waterproof® film through a COM GUIDE is frequently used to evaluate many of these important properties.

The URGA Plate Control Wedge 1982 was developed jointly by FOGRA(Deutsche Forschungsgesellschaft fur Druck- und Reproduktionstechnik e.V.) and UGRA (System Brunner, Switzerland) for platemaking and has found much use in graphic arts for additional refinements in exposure control, resolution and print reproduction curves or Isocontour®. Use of microline targets permits precise determination of optimum exposure conditions for films and plates. Calibrated halftone targets permit direct calculation of dot gain and thus determination of print and film reproduction curves commonly known as Isocontours. The Isocontour curve is essentially a quantitative assessment of the dot fidelity of the film of plate being examined.

These measurements given in the examples provide information on the amount of color(density), dot resolution of definition (UGRA 200 lpi and microline) and the nature of the Isocontour® or print reproduction curve from the 50% dot gain as measured by the COM GUIDE.

Example 1

Forming a Fluorescent Orange Image

The following components were used to form an image:

Photosenstive element: Waterproof® fluorescent Pink film, sold by E.I. duPont de Nemours and Co.(DuPont), Ltd., Wilmington, Del. This has a release layer, an adhesive layer and a fluorescent pink first layer.

Aqueous Permeable Colorant-Containing Composition: CV Pantone® yellow ink, sold by DuPont.

Transfer Element: The transfer element used was a commercially available WaterProofe Transfer Sheet (manufactured by E.I. Du Pont de Nemours and Co., Wilmington, Del.).

Process Steps

Step 1: CV Pantone® yellow ink, sold by E.I. duPont de Nemours and Co.(DuPont), Ltd., Wilmington, Del., was coated onto a Waterproof® fluorescent Pink film, sold by DuPont, using a Waterproof Color Versatility Coater, sold by DuPont. The sample was dried.

Step 2: The inked photosensitive element was placed in a vacuum frame with the ink layer up, i.e., facing the source of actinic radiation. A negative separation transparency for magenta was placed on top of the ink layer with the emulsion side of the transparency in contact with the ink layer and the base side up. A vacuum was drawn on the element and separation transparency for about 90 seconds prior to exposure. The element was exposed for about 20 seconds with the radiation from a 5 kW high pressure mercury vapor lamp, (Olec L1261 lamp, Olec Olix AL985 Integrator and Olite AL53-100 power supply, Olec, Inc., Irvine, Calif.) about 137 cm above the element and separation transparency. After exposure, the separation transparency was removed from the exposed photosensitive element.

Step 3: The element was then developed and dried using a WaterProof® WashOff Unit (DuPont) which utilized a 24° C. water stream and rotating brush to remove the non-exposed areas of the first layer and its overlying ink layer. The element was then dried at a dryer temperature of approximately 110° F.

Step 4: The coversheet of the transfer element was removed by peeling. The image-carrying element was placed on the revealed layer of the transfer element with the image down and then laminated using a WaterProof® Laminator (DuPont) at 115–120° C., 150 lbs (about 68 kg), 800 mm/min.

The support element and release layer were next removed by peeling, and thus, effectively transferring the fluorescent orange image to the transfer element. The result was a wrong-reading fluorescent orange image on the transfer element.

Step 5: The fluorescent orange image on the transfer element was placed image down on a piece of LOE paper stock and then laminated at 115–120° C., 450 lbs (about 204 kg), and 600 mm/min. The transfer element was then removed by peeling to reveal a stain-free fluorescent orange proof on LOE paper. The proof image measurements are shown in Table 1.

TABLE 1

| Color | Color Density | UGRA (200 lpi) % Dots H/S[1] | UGRA Resolution ($\mu$) H/S[1] | COM GUIDE 50% Dot Grain |
|---|---|---|---|---|
| Fluorescent Orange | 1.77 | 2/90 | 10/12 | 33 |

[1]is Highlight/Shadow

The transferred image was an accurate simulation of Pantone® color 811 fluorescent orange, but the process for making the image lacked the fluorescent ink problem of the settling out of the fluorescent materials.

In Examples 2–9, the process steps detailed in Example 1 were followed.

Examples 2

Formation of a Fluorescent Magenta Image

Example 1was repeated with the following differences: a CV Pantone® Blue 072 ink, sold by DuPont, was used in place of the CV Pantone® yellow ink to result in an accurate simulation of Pantone® color 814 fluorescent magenta. Results are shown in Table 2 below.

TABLE 2

| Color | Color Density | UGRA (200 lpi) % Dots H/S | UGRA Resolution (μ) H/S | COM GUIDE 50% Dot Grain |
|---|---|---|---|---|
| Fluorescent Magenta | 2.16 | 5/97 | 4/8 | 16 |

Example 3

Preparation of a Metallic Green Image

Example 1 was repeated with the following differences: a CV Pantone® ink blend comprised of 10% CV Pantone® Green and 90% CV Pantone® Transparent Extender was used in place of the CV Pantone® yellow ink. A Waterproof® Silver film was used in place of the WaterProof® fluorescent pink. The film result was an accurate simulation of Pantone® metallic color 8281, a green-shaded silver color without the metallic ink problem of settling out of the metallic materials. Results are shown in Table 3 below.

TABLE 3

| Color | Color Density | UGRA (200 lpi) % Dots H/S | UGRA Resolution (μ) H/S | COM GUIDE 50% Dot Grain |
|---|---|---|---|---|
| Metallic 8281 | 0.78 | 5/75 | 8/20 | 28 |

Example 4

Preparation of Metallic Green Image

Example 3 was repeated with the following differences: a CV ink blend composed of 9.6% CV Pantone® Blue 072, 2.4% CV Pantone® Process Blue and 88.0% CV Pantone® Transparent Extender was used in place of the CV Pantone® ink blend comprised of 10% CV Pantone® Green and 90% CV Pantone® Transparent Extender resulting in a metallic color simulation of Pantone® color 8182 without the metallic ink problems of settling out of the metallic materials. Results are shown in Table 4 below.

TABLE 4

| Color | Color Density | UGRA (200 lpi) % Dots H/S | UGRA Resolution (μ) H/S | COM GUIDE 50% Dot Grain |
|---|---|---|---|---|
| Metallic 8182 | 0.94 | 5/75 | 8/20 | 27 |

Example 5

Preparation of A Blue-green Gold Image

Example 1 was repeated with the following differences: a CV ink solution comprised of 30% CV Pantone® Blue and 70% Pantone® Transparent Extender was used in place of the CV Pantone® yellow ink and a Waterproof® Gold film was used in place of the WaterProof® fluorescent pink film resulting in an accurate simulation of Pantone® metallic color 8741, a blue-green-shaded gold color without the problems of metallic materials settling out. Results are shown in Table 5 below.

TABLE 5

| Color | Color Density | UGRA (200 lpi) % Dots H/S | UGRA Resolution (μ) H/S | COM GUIDE 50% Dot Grain |
|---|---|---|---|---|
| Metallic Gold 8741 | 1.16 | 3/90 | 10/15 | 23 |

Example 6

Preparation of Dark Brown-Gold Image

Example 1 was repeated with the following differences: a CV ink composition comprised of 55% CV Pantone® Purple, 25% Pantone® Black and 25% of CV Pantone® Transparent Extender was used in place of the CV Pantone® yellow ink and a Waterproof® Gold film was used in place of the WaterProof® fluorescent pink film resulting in an accurate simulation of Pantone® metallic color 8543, a dark brown-shaded gold color without the problems of metallic materials settling out. Results are shown in Table 6 below.

TABLE 6

| Color | Color Density | UGRA (200 lpi) % Dots H/S | UGRA Resolution (μ) H/S | COM GUIDE 50% Dot Grain |
|---|---|---|---|---|
| Metallic gold 8543 | 1.53 | 5/95 | 12/10 | 15 |

Example 7

Preparation of an Intense Gold-Green Metallic Image

Example 1 was repeated with the following differences: A CV ink composition comprised of 5% of CV Pantone® 012 ink, 28% CV Pantone® Green and 67% of CV Pantone® Transparent Extender was used in place of the CV Pantone® yellow ink and a Waterproof® Gold film was used in place of the WaterProof® fluorescent pink film resulting in an accurate simulation of Pantone® metallic color 8703, an intense gold green metallic color without the problems of settling out of the metallic material. Results are shown in Table 7 below.

TABLE 7

| Color | Color Density | UGRA (200 lpi) % Dots H/S | UGRA Resolution (μ) H/S | COM GUIDE 50% Dot Grain |
|---|---|---|---|---|
| Metallic gold 8703 | 1.41 | 3/90 | 12/15 | 19 |

Example 8

Preparation of a Multi-Color Image Having a Silver Lustre

Photosenstive element: Waterproof® Black film, sold by E.I. duPont de Nemours and Co., Ltd., (DuPont), Wilmington, Del.

Transfer Element: The transfer element used was a commercially available WaterProof® Transfer Sheet (manufactured by E.I. Du Pont de Nemours and Co., Wilmington, Del.).

Process Steps

Step 1: The WaterProof® Black film was placed in a vacuum frame with the colorant containing black layer up, i.e., facing the source of actinic radiation. A negative separation transparency for black was placed on top of the colorant containing black layer with the emulsion side of the transparency in contact with the colorant containing black layer and the base side up. A vacuum was drawn on the element and separation transparency for about 90 seconds prior to exposure. The element was exposed for about 20 seconds with the radiation from a 5 kW high pressure mercury vapor lamp, (Olec L1261 lamp, Olec Olix AL985 Integrator and Olite AL53-100 power supply, Olec, Inc., Irvine, Calif.) about 137 cm above the element and separation transparency. After exposure, the separation transparency was removed from the exposed photosensitive element.

Step 2: The element was then developed and dried using a WaterProof® WashOff Unit (DuPont) which utilized a 24° C. water stream and rotating brush to remove the non-exposed areas of the colorant containing layer. The element was then dried at a dryer temperature of approximately 110° F.

Step 3: The coversheet of the transfer element was removed by peeling. The image-carrying element was placed on the revealed layer of the transfer element with the black image down and then laminated using a WaterProof® Laminator, Model Delta 2, (DuPont) at 100° C., 150 lbs, 800 mm/min.

The support element and release layer were removed by peeling, and thus, effectively transferring the black image to the transfer element. The result was a wrong-reading black image on the transfer element.

Step 4: Steps (1) to (3) were repeated to form yellow, magenta and cyan images on the black image present on the transfer element from Step 3 using yellow, magenta and cyan films, respectively, and the corresponding negative separation transparency, and successively transferring the yellow, magenta and cyan images on to the black image on the transfer element to form a four color image on the transfer element.

Step 5: Steps (1) to (3) from Example 1 were repeated using a WaterProof® Silver film (DuPont), with an aqueous colorant containing composition comprising 3% Pantone® Blue 072, 17% Pantone® Process Blue and 80% Pantone® Transparent White Extender coated on top of the WaterProof® Silver film. A blue shaded silver metallic image equivalent to Pantone® Color # 8223 resulted. The Pantone® Transparent White Extender is a clear (uncolored) photoactive liquid which is used to reduce the densities of the WaterProof® CV inks. (For example, matching a Pantone® pastel color such as Pantone® pastel color number 9320 requires the addition of 99% Pantone® Transparent Extender to 1% Pantone Rubine Red WaterProof® ink. The extender essentially "extends" the color downward to lower densities. This technique of using Transparent White extenders is used throughout the Pantone® Color matching systems and is included in the many Pantone® Color Formula Guides.)

Step 6: The blue-shaded metallic silver image was then laminated in register on to the 4 color image on the transfer sheet formed in Step 4 of this example to form a 5 color image having a metallic silver luster on the transfer element using the process described in Step 4 of Example 1.

Step 7: The 5 color image on the transfer element was then transferred to LOE paper stock by placing the blue shaded silver metallic image on the transfer element in contact with the LOE paper stock and then laminating at 100° C., 450 lbs (about 204 kg), and 800 mm/min. The transfer element was then removed by peeling to reveal a stain-free 5 color image having a metallic silver lustre on LOE paper.

Example 9

Preparation of Multi-Color Image Having a Blue Shaded Metallic Luster

Example 8 was repeated with the following exception: the blue shaded metallic image was transferred to the transfer element first followed by the sequential transfer of the yellow, magenta, cyan and black images resulting in the finally transferred image on LOE paper having the black image adjacent the paper and the blue shaded metallic image farthest from the paper. In this example a different order in which the metallic luster is provided to the image is exemplified. Since the blue shaded metallic image is opaque, none of the cyan, magenta, yellow and black images should fall directly under it.

Example 10

Formation of a Medium-Blue Image Having an Intense Blue-Silver Luster

Example 1 was repeated except that a DuPont Waterproof® CV solution comprised of 3% Pantone® Blue 072, 17% Pantone® Process Blue and 80% Pantone® Transparent white was coated on DuPont Waterproof® silver film rather than Waterproof® Pink film. This gave an accurate simulation of Pantone® metallic color 8223, an overall medium blue color with intense blue-silver luster without the metallic ink problems of settling out of the metallic materials.

Example 11

Identification of Fluorescence

A series of DuPont Waterproof® CV formulations were made up for coating on DuPont Waterproof® Fluorescent Pink film. These formulations were comprised as follows:

Film A: 10% DuPont Pantone® Yellow CV ink

90% DuPont Panton® Transparent White

Film B: 20% DuPont Pantone® Yellow CV ink

80% DuPont Pantone® Transparent White

Film C: 50% DuPont Pantone® Yellow CV ink

50% DuPont Pantone® Transparent White

Film D: 100% DuPont Pantone® Yellow CV ink

These formulations were coated on separate films of DuPont Waterproof® Fluorescent Pink using the DuPont Waterproof® CV coater, dried, and then processed through a DuPont Waterproof® processor. Each coated film was then transferred successively to DuPont Waterproof® Transfer and finally to LOE gloss paper. The resulting color images were then examined in 5000K light and also under UV irradiation.

In 5000K light:

The colored images showed dominantly fluorescent pink color at the low concentrations of DuPont Pantone Yellow CV ink as in Film A and Film B and reduced levels of fluorescence at the higher levels of Film C and Film D. Also the color is observed to shift to increasing high amounts of yellow shade with higher a* readings as measured on a Hunter ColorQUEST Spectrosensor (Hunter Labs., Reston, Va.) The fluorescence can be measured by making reflectance readings with the Hunter Spectrosensor and also can be easily seen visually by exposing the fluorescence samples to an ultraviolet light source. Placing the fluorescent samples in a Teaneck Graphics NFDS Instant Fast Drawdown Vacuum frame(Teaneck Graphics CO., Carlstadt, N.J.) containing an Olec exposure assembly with Lamphead Model L 11, RF53 overhead filter, L 1250 bulb and Dylux® ultraviolet filter (all from Olec Graphics, Anaheim, Calif.) and the light source turned on, the highly fluorescent areas (Films A and B) show the characteristic fluorescent brightness and color, the areas of Films C and D show fluorescence, but in diminished amount.

As a control, a DuPont Waterproof® CV coating comprised of 100% Pantone® Yellow CV processed and transferred successively to LOE paper, when exposed to the same ultraviolet light source, gave fluorescent brightness and color. Fluorescent color and brightness can be easily observed by irradiating with this type of ultraviolet light.

Examples 13–14

Verification of Fluorescence

The images formed in Examples 1 and 2 were placed under a 5000K light and also under UV irradiation. The UV irradiation confirmed that the images formed exhibit a fluorescent hue.

Example 15

Cross-Section Study

A sample was prepared by coating 100% Pantone Reflex Blue on DuPont Waterproof® Silver film followed by transfer to DuPont Waterproof® Transfer film.

A cross-section of this sample was studied by both Transmission Electron Microscopy (TEM) and optical microscopy.

Interlayer adhesion was insufficient to keep the coating layers together in the TEM samples so only the metallic layer(silver), which stuck to the embedding epoxy, could be found for imaging. Optical microscopy photographs show some diffusion of the CV color layer into the silver layer but not complete dissolving. There appeared to be a separate silver layer, a diffuse layer of reflex blue CV and silver and a top layer of pure reflex blue CV. This is confirmed by the observation during TEM of the top layer being stripped away exposing a silver-only layer.

What is claimed is:

1. A process for making an element for forming a final image with an overall attribute by exposure to actinic radiation, the process comprising:

providing a support element having a surface;

applying a first layer having a first surface and a second surface to the surface of the support element, the first surface of the first layer being adjacent to the surface of the support element and the second surface of the first layer being opposite the first surface;

applying, prior to image-wise exposure to actinic radiation, a second layer adjacent to the second surface of the first layer, the second layer having an inner surface and an outer surface, the first layer comprising a photosensitive composition and a feature which imparts a dominant attribute to the first layer, the feature being a fluorescent feature and the second layer comprising a first colorant;

wherein the overall attribute of the final image is defined by the dominant attribute of the first layer.

2. The process of claim 1, wherein the first layer includes a first photosensitive composition, and the second layer includes a second photosensitive composition.

3. The process of claim 1, wherein the feature which imparts a dominant attribute to the first layer is a fluorescent material.

4. The process of claim 1, wherein the first colorant is selected from the group consisting of a dye or pigment.

5. The process of claim 4, wherein the first layer comprises a second colorant.

6. The process of claim 5, wherein the color of the second colorant is different from the color of the first colorant.

7. The process of claim 1 further comprising the step of exposing the element with actinic radiation through a separation transparency having a pattern, the separation transparency applied to the outer surface of the second layer, for a period of time sufficient to form image-wise exposed regions on the first layer; removing the separation transparency and developing the element to produce a pattern which is substantially the same as the pattern of the separation transparency.

8. The process of claim 7 wherein the first layer is adhered to the support element with an adhesive and a release layer is located between the adhesive and the surface of the support element, the process further comprising the step of; applying a transfer element to the produced pattern; separating the support element from the first layer to reveal the adhesive and adhering the revealed adhesive to a permanent support.

9. The element made by the process of claim 8.

10. An element made by the process of claim 1.

11. An element for forming a final image having an overall attribute by exposure to actinic radiation, comprising:

a support element having a surface;

a first layer having a first surface and a second surface, the first surface of the first layer being adjacent to the surface of the support element and the second surface of the first layer being opposite the first surface;

a second layer adjacent to the second surface of the first layer applied prior to image-wise exposure to actinic radiation, the second layer having an inner surface and an outer surface, the first layer comprising a photosensitive composition and a feature which imparts a dominant attribute to the first layer, the feature being a fluorescent feature, and, the second layer comprising a first colorant; wherein the overall attribute of the final image is defined by the dominant attribute of the first layer.

12. The element of claim 11 further comprising a separation transparency having a pattern, the separation transparency applied to the outer surface of the second layer wherein exposure of the element to actinic radiation through the separation transparency for a sufficient period of time forms image-wise exposed regions on the first layer resulting in a pattern formed on the element which is substantially the same as the pattern of the separation transparency.

13. The element of claim 11, wherein the first layer includes a first photosensitive composition, and the second layer includes a second photosensitive composition.

14. The element of claim 11, wherein the feature which imparts a dominant attribute to the first layer is a fluorescent material.

15. The element of claim 11, wherein the first colorant is selected from the group consisting of a dye or pigment.

* * * * *